(12) United States Patent
Youn et al.

(10) Patent No.: US 10,189,203 B2
(45) Date of Patent: Jan. 29, 2019

(54) METHOD FOR FORMING MICROPATTERN OF POLYIMIDE USING IMPRINTING

(71) Applicant: National Institute of Advanced Industrial Science and Technology, Tokyo (JP)

(72) Inventors: Sung Won Youn, Ibaraki (JP); Sang Cheon Park, Ibaraki (JP); Hiroshi Hiroshima, Ibaraki (JP); Hideki Takagi, Ibaraki (JP); Kenta Suzuki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 211 days.

(21) Appl. No.: 15/029,481

(22) PCT Filed: Aug. 29, 2014

(86) PCT No.: PCT/JP2014/072804
§ 371 (c)(1),
(2) Date: Apr. 14, 2016

(87) PCT Pub. No.: WO2015/056487
PCT Pub. Date: Apr. 23, 2015

(65) Prior Publication Data
US 2016/0263814 A1  Sep. 15, 2016

(30) Foreign Application Priority Data
Oct. 18, 2013 (JP) ................ 2013-217645

(51) Int. Cl.
*B29C 59/02* (2006.01)
*G03F 7/00* (2006.01)
*B29C 35/08* (2006.01)
*B29C 43/02* (2006.01)
*B29C 43/52* (2006.01)
*G03F 7/038* (2006.01)
*C08L 79/08* (2006.01)
*B29K 79/00* (2006.01)

(52) U.S. Cl.
CPC ........ *B29C 59/022* (2013.01); *B29C 35/0805* (2013.01); *C08L 79/08* (2013.01);
(Continued)

(58) Field of Classification Search
CPC ............. B29C 59/022; B29C 35/0805; B29C 2043/025; B29C 43/52; B29C 43/021;
(Continued)

(56) References Cited

U.S. PATENT DOCUMENTS

2004/0013953 A1  1/2004 Mune et al.
2004/0041129 A1  3/2004 Itatani et al.
(Continued)

FOREIGN PATENT DOCUMENTS

CN  1448421 A  10/2003
CN  1468907 A  1/2004
(Continued)

*Primary Examiner* — Robert J Grun
(74) *Attorney, Agent, or Firm* — Hoffman & Baron, LLP

(57) ABSTRACT

Provided is a method for forming a pattern of polyimide that is simpler and is more excellent in the pattern shape and in the dimensional accuracy in comparison with the conventional techniques of patterning polyimide, such as photolithography and laser processing. In a method for forming a micropattern of polyimide, which includes using as polyimide a solvent-soluble polyimide resin composition that is photosensitive and is moldable at a temperature of less than or equal to a glass-transition temperature; patterning the composition using thermal imprinting; and thermally curing the composition, ultraviolet irradiation is performed after the composition is released from a mold after a molding step.

4 Claims, 6 Drawing Sheets

Heating after Light Exposure
and Thermal Curing (e) Heat Treatment

(52) U.S. Cl.
CPC .......... *G03F 7/0002* (2013.01); *G03F 7/0387* (2013.01); *B29C 43/021* (2013.01); *B29C 43/52* (2013.01); *B29C 2035/0827* (2013.01); *B29C 2043/025* (2013.01); *B29C 2059/023* (2013.01); *B29K 2079/08* (2013.01)

(58) Field of Classification Search
CPC ....... B29C 2035/0827; B29C 2059/023; C08L 79/08; G03F 7/0387; G03F 7/0002; B29K 2079/08
See application file for complete search history.

(56) References Cited

U.S. PATENT DOCUMENTS

| | | |
|---|---|---|
| 2004/0146263 A1 | 7/2004 | Mune et al. |
| 2008/0275181 A1 | 11/2008 | Win et al. |
| 2009/0186295 A1 | 7/2009 | Win et al. |
| 2012/0097435 A1 | 4/2012 | Goshima et al. |

FOREIGN PATENT DOCUMENTS

| | | | |
|---|---|---|---|
| CN | 1504780 | A | 6/2004 |
| CN | 1978529 | A | 6/2007 |
| CN | 101395234 | A | 3/2009 |
| JP | 2003183496 | A | 7/2003 |
| JP | 2003-234283 | A | 8/2003 |
| JP | 2008-307808 | A | 12/2008 |
| JP | 2010260902 | A | 11/2010 |
| JP | 2011077251 | A | 4/2011 |
| JP | 2011-206938 | A | 10/2011 |
| JP | 2013-042124 | A | 2/2013 |
| JP | 2013-154637 | A | 8/2013 |
| WO | WO 02/23276 | A1 | 3/2002 |
| WO | WO 2005/116152 | A1 | 12/2005 |

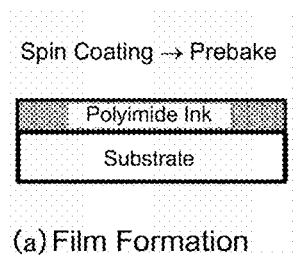
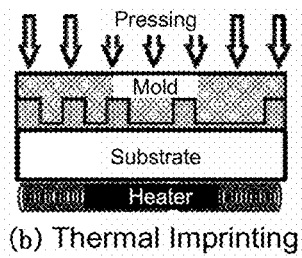
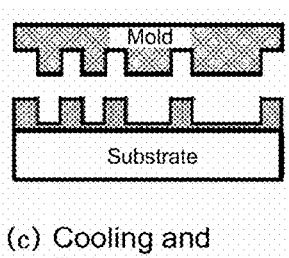
Fig. 1A (a) Film Formation
Fig. 1B (b) Thermal Imprinting
Fig. 1C (c) Cooling and Releasing
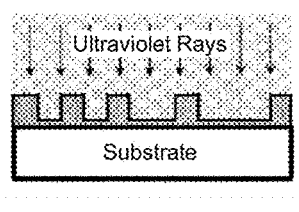
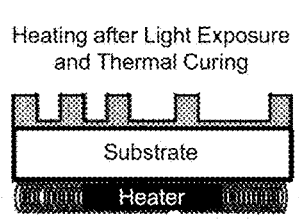
Fig. 1D (d) Light Exposure
Fig. 1E (e) Heat Treatment
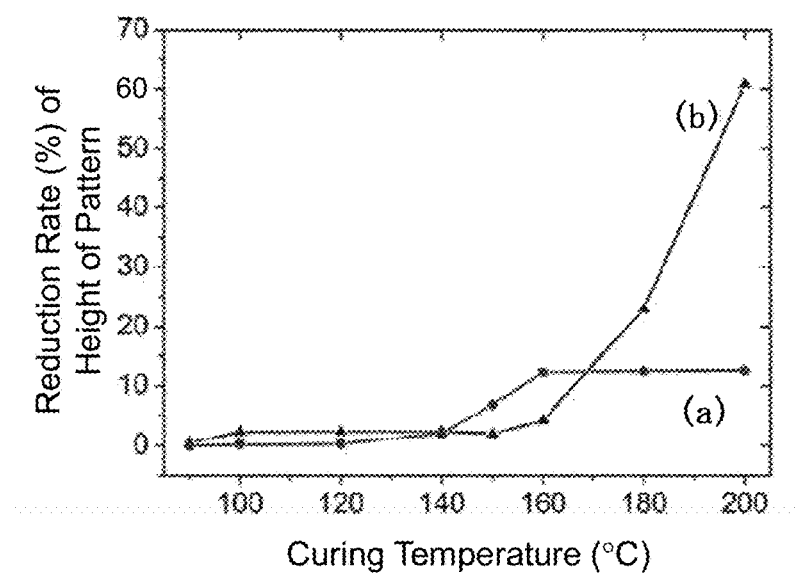
Fig. 2

50 μm L&S Pattern

20 μm L&S Pattern

10 μm L&S Pattern

5 μm L&S Pattern

3 μm L&S Pattern

150nm 1:2 L/S

200nm 1:2 L/S

300nm 1:1 L/S

Fig. 7A
Fig. 7B
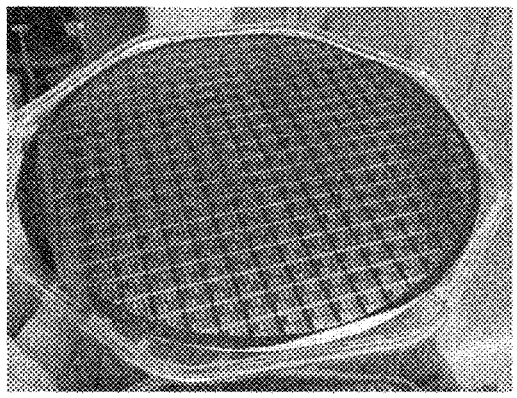
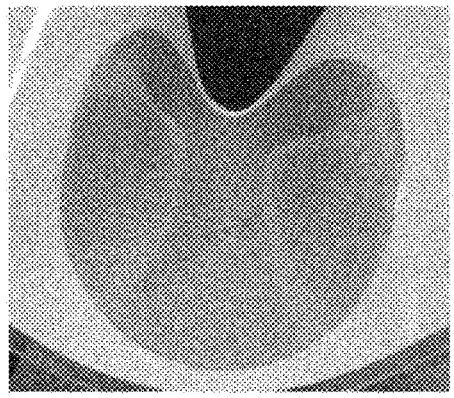

METHOD FOR FORMING MICROPATTERN OF POLYIMIDE USING IMPRINTING

CROSS-REFERENCE TO RELATED APPLICATIONS

This application is the U.S. National Phase of International Patent Application No. PCT/JP2014/072804, filed on 29 Aug. 2014, which claims benefit of Japanese Patent Application No. 2013-217645, filed on 18 Oct. 2013, the contents of which are incorporated herein by reference in their entirety.

TECHNICAL FIELD

The present invention relates to a method for forming a micropattern of polyimide using imprinting.

BACKGROUND ART

Conventionally, photolithography that uses a polyamic acid precursor of photosensitive polyimide has been mainly used as a method for forming a micropattern of polyimide. The method includes transferring a pattern to a surface of a substrate, which is coated with a photosensitive polyimide precursor, through light exposure using a photomask, performing heat treatment (PEB: post exposure bake) as needed, removing exposed portions or unexposed portions using a developing solution, and performing heat treatment on a pattern of the polyimide precursor obtained through the development, thereby converting the pattern into a pattern of polyimide (see Patent Literature 1).

However, such a method has a problem in that a pattern structure shrinks by 30 to 50% due to a thermal imidization reaction of the amic acid precursor of polyimide, and it is thus difficult to form a microstructure with a sharp line edge or a rectangular cross-section, or a submicrometer pattern.

In contrast, Patent Literature 2 introduces a method for producing ink-state modified polyimide that has been imidized, and a patterning method using photolithography. The patterning method includes (1) a step of applying a photosensitive polyimide composition, which contains modified polyimide, a photosensitizing agent, a thermal curing agent, and a solvent, to a substrate to form a film thereon, (2) a step of heating the obtained film to remove the solvent, (3) a step of exposing the composition with the solvent removed to light through a photomask, (4) a step of performing development after the light exposure, and (5) a step of heating the composition to a temperature of greater than or equal to the curing temperature of the thermal curing agent after the development.

The greatest advantage of the above method is that shrinkage due to an imidization reaction does not occur during the thermal curing step because ink-state polyimide that has been imidized is used. However, as the dissolution properties in a developing solution and in a solvent are not good in the polyimide state, it is difficult to form a micropattern with photolithography. So far, only experimental proofs of patterns with a scale of down to several tens of micrometers have been reported.

As another method for solving the problem of shrinkage due to an imidization reaction, there is also known a method for forming a micropattern through laser processing, etching, or the like, using polyimide that has been imidized.

However, although laser processing, which is a sequential processing method, is suitable for forming a hole, such as a via shape, it has low productivity for forming complex patterns, and further, it is difficult to form submicrometer-scale patterns with laser processing, which is problematic.

In addition, etching involves a long process including, for example, (1) a step of forming a polyimide film on a substrate, (2) a step of forming a resist pattern through photoresist application, pattern exposure through a photomask, PEB, a developing process, and the like, (3) a step of etching the polyimide film using the resist pattern as etching resist, (4) a step of removing the photoresist layer, and (5) processing the pattern of polyimide obtained through the etching. Further, polyimide has problems in that while it has excellent chemical stability, it has quite a low etching rate and thus has low productivity.

Meanwhile, a thermal imprinting technique has been used as a simpler method for forming a polyimide pattern in comparison with the conventional techniques of forming a micropattern of polyimide. The method includes, in order to obtain moldability suitable for imprint molding, heating polyimide to a temperature of greater than or equal to the glass-transition temperature (Tg) until it softens, performing pressure molding by pressing projection/recess patterns of a mold against the polyimide, cooling the polyimide and the mold to a temperature of less than or equal to Tg in such a state, and removing the mold, thereby forming projection/recess patterns on the surface of the polyimide. Using such a thermal imprint molding technique is advantageous in that the number of steps can be significantly reduced as compared to that of the aforementioned photolithography.

However, as the glass-transition temperature (Tg) of polyimide is typically greater than or equal to 300° C., heating should be performed at a temperature as high as 300 to 400° C., which may influence the pattern transfer accuracy due to thermal expansion, decrease the alignment accuracy, or have a problem of thermal stress.

There is still another problem in that a highly heat-resistant mold should be selected at a temperature of greater than or equal to 300° C., or the mold releasability would decrease as a result of a release film, which is formed on the surface of the mold, having been thermally oxidized. Further, there is also a problem in that the heating and cooling process time becomes longer, which can result in increased process cost.

Meanwhile, Patent Literature 3 describes forming a member for a display, which can be cured at a temperature of less than or equal to 250° C. through thermal imprinting, using a curable composition containing polyimide and resin other than polyimide. However, this technique is intended to form partitions for a plasma display with a pitch of about 160 μm and a line width of about 20 μm, and does not consider forming submicrometer patterns.

CITATION LIST

Patent Literature

Patent Literature 1: JP 2003-183496 A
Patent Literature 2: JP 2010-260902 A
Patent Literature 3: JP 2011-77251 A

SUMMARY OF INVENTION

Technical Problem

The present invention is made in view of the foregoing. It is an object of the present invention to provide a method for forming a pattern of polyimide that is simpler and is more excellent in the pattern shape and in the dimensional accuracy than the conventional techniques of patterning polyimide, such as photolithography and laser processing.

Solution to Problem

The inventors have conducted concentrated studies to achieve the above object, and found that the aforementioned problems can be solved by, in a method for forming a micropattern of polyimide, which includes using as polyimide a solvent-soluble polyimide resin composition that is photosensitive and is moldable at a low temperature; patterning the composition using thermal imprinting; and thermally curing the composition, performing ultraviolet irradiation after releasing the composition from a mold after a molding step.

The present invention has been implemented based on the foregoing findings. According to the present invention, the following invention is provided.

[1] A method for forming a micropattern of polyimide using thermal imprinting, the method including using a solvent-soluble polyimide resin composition that is photosensitive and is moldable at a temperature of less than or equal to a glass-transition temperature; and performing ultraviolet irradiation after releasing the composition from a mold and before thermally curing the composition.

[2] The method for forming a micropattern of polyimide according to [1], in which the thermal curing includes two-stage heating where the solvent-soluble polyimide resin composition is held at a post exposure bake temperature of the composition for a given period of time while a temperature is increased from a room temperature to a heat treatment temperature.

[3] The method for forming a micropattern of polyimide according to [1] or [2], in which the micropattern is a submicrometer pattern with a rectangular cross-section.

[4] The method for forming a micropattern of polyimide according to any one of [1] to [3], in which the solvent-soluble polyimide is block copolymerized polyimide.

[5] Polyimide including a submicrometer pattern with a rectangular cross-section formed thereon, the pattern being produced with the method for forming a micropattern according to any one of [1] to [4].

Advantageous Effects of Invention

According to the present invention, it is possible to produce even a submicrometer pattern with a rectangular cross-section, which has been conventionally difficult to achieve, with high accuracy. Using such a method can provide a packaged wiring board that is low in price and excellent in quality, and a member for an optical device.

BRIEF DESCRIPTION OF DRAWINGS

FIGS. 1A-1E are diagrams showing a summary of a method for forming a pattern of the present invention.

FIG. 2 is a graph showing the relationship between the heat treatment (curing) temperature and pattern structure deformation (a) when a photosensitive polyimide resin composition is used and (b) when a non-photosensitive polyimide resin composition is used.

FIGS. 7A-7B are photographs of a flexible polyimide substrate obtained in an example, specifically, FIG. 7A is a photograph after thermal imprint molding, and FIG. 7B is a photograph of a polyimide substrate after it is peeled off a Si substrate (and before it is cured).

DESCRIPTION OF EMBODIMENTS

Figure 3:
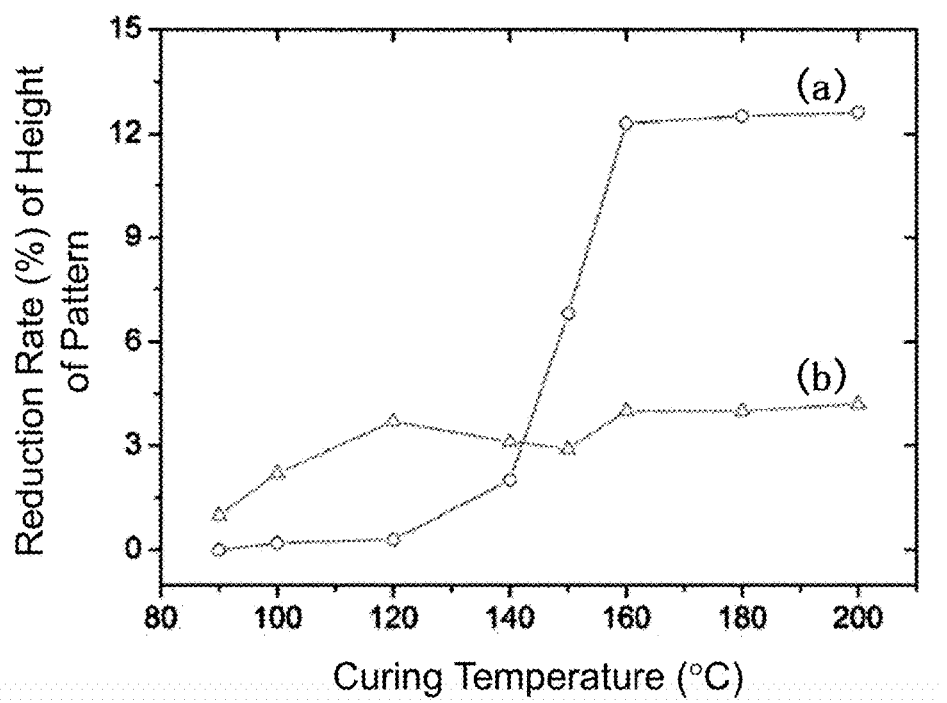
FIG. 3 is a graph showing the influence of the temperature conditions of imprint molding ((a) 100° C. and (b) 120° C.) on the stability of pattern dimensions.

A method of the present invention will be described in detail below.

The present invention is characterized by, in a method for forming a submicrometer pattern of polyimide through thermal imprinting, using a solvent-soluble polyimide resin composition, which is photosensitive and has a glass-transition temperature of less than or equal to 200° C., and performing ultraviolet irradiation after releasing the composition from a mold and before thermally curing the composition.

FIGS. 1A-1E are diagrams showing a summary of the thermal imprinting of the present invention.

As shown in FIG. 1A, a polyimide film is first applied to a substrate, and is then prebaked ((a) film formation step). After that, the polyimide film is heated to a temperature of less than or equal to the glass-transition temperature, and then, as shown in FIG. 1B, projection/recess patterns of a mold are pressed against the polyimide film to form a pattern thereon through thermal imprint molding (thermal imprinting step).

After the imprint molding, as shown in FIG. 1C, the polyimide and the mold are cooled to a temperature of less than the glass-transition temperature so that the polyimide is released from the mold ((c) cooling and releasing step), and then, as shown in FIG. 1D, light exposure is performed ((d) light exposure step). Then, as shown in FIG. 1E, heat treatment is performed as a final step ((e) heat treatment step).

As described above, a printing method that uses the conventional polyimide has a problem in that thermal molding at a high temperature is necessary as the glass-transition temperature of common polyimide is greater than or equal to 300° C. In order to solve such a problem, using a polyimide precursor (i.e., polyamic acid) that can be thermally molded at a low temperature is considered. However, there remains a problem in that although molding at a low temperature is possible, large shrinkage occurs due to an imidization reaction (i.e., dehydration-condensation reaction).

Thus, the present invention allows thermal molding at a low temperature and suppresses shrinkage, which would occur due to an imidization reaction, by using a solvent-soluble polyimide resin composition that has been imidized and can be molded at a temperature of less than or equal to the glass-transition temperature.

Polyimide that has been molded through thermal imprinting is, after being released from a mold, subjected to heat treatment (curing) in order to have improved characteristics in heating resistance, light resistance, and the like. However, in the heat treatment step, a film thickness reduction (i.e., a reduction in the thickness of a polyimide film) and deformation in the height of a pattern structure occur.

The present invention solves such problems by providing photosensitivity and performing ultraviolet exposure before the heat treatment step.

Hereinafter, each step will be described in further detail.

(a) Film Formation Step

A solvent-soluble polyimide resin composition of the present invention is applied to a substrate of Si or the like (see FIG. 1A). Although the coating method and the thickness of the applied film are not particularly limited, it is preferable to form a film with a thickness of about 25 μm using spin coating.

Next, the applied film is prebaked and thus dried.

Solvent-soluble polyimide as used in the present invention has already been imidized. Therefore, high-temperature treatment required for imidization is not needed, and molding can be performed at a low temperature of less than or equal to the glass-transition temperature. Further, as the polyimide is soluble in solvents, it can be a perfect polyimide varnish. Thus, it is possible to form a film only by evaporating a solvent.

Such solvent-soluble polyimide is already known. In the present invention, commercially available solvent-soluble polyimide that can be molded at a temperature of less than or equal to the glass-transition temperature can be appropriately selected and used. In particular, solvent-soluble block copolymerized polyimide, which is obtained by allowing polyimide to contain a given amount of a given region that imparts a desired property through block copolymerization, is preferably used.

Examples of such solvent-soluble block copolymerized polyimide include siloxane-modified block copolymerized polyimide with a low warping property that is formed using a diamine(s) having siloxane bonds in molecular skeleton thereof (siloxane bond-containing diamine(s)) as the diamine compounds (see WO2002/023276 A and WO2005/116152 A). As the block copolymerized polyimide can be molded at a temperature of less than or equal to the glass-transition temperature, and has been already imidized, molding at a low temperature and with low shrinkage is possible.

Resin compositions that use solvent-soluble polyimide are generally divided into photosensitive compositions and non-photosensitive compositions. An imprinting technique is a press technique using a mold. Thus, a pattern formation step using light exposure is not needed. Therefore, it is desirable to select a non-photosensitive composition from the perspective of simplifying the step. However, there is a problem in that deformation of a pattern structure occurs during heating for the heat treatment (curing).

Thus, the present invention can provide a method for forming a micropattern with high accuracy by using a photosensitive solvent-soluble polyimide resin composition.

FIG. 2 is a graph showing the relationship between the heat treatment (curing) temperature and pattern structure deformation (a) when a photosensitive polyimide resin composition, which is used in the following example, is used and (b) when a non-photosensitive polyimide resin composition (without a photosensitizing agent) is used.

As is clear from FIG. 2, when a non-photosensitive polyimide resin composition is used, the dimensional accuracy of the surface of a polyimide substrate would undesirably decrease if the composition is heated to a temperature of greater than or equal to 160° C. in a curing step. In contrast, when a photosensitive polyimide resin composition is used, it can be seen that shrinkage due to deformation of a pattern structure can be significantly reduced.

The photosensitive solvent-soluble polyimide resin composition of the present invention contains the aforementioned solvent-soluble polyimide, a photosensitizing agent, and a solvent. As the photosensitizing agent, a photosensitizing agent that imparts negative photosensitivity is used.

(b) Thermal Imprinting Step

After that, a pattern is formed (transferred) through thermal imprint molding using a mold that has projections/recesses formed thereon (see FIG. 1(b)). That is, after a substrate with a polyimide film obtained in the previous step is heated to a predetermined temperature, pressure molding is performed using a mold that has projection/recess patterns formed thereon.

The characteristics that are required of the mold materials are the releasability from polyimide, heat resistance and durability against a thermal imprint molding step, and the like. For example, Si, quartz, or Ni is used, or resin is also used for some of molds.

In particular, a flexible resin mold is suitable for uniformly transferring a pattern to a large area because, in comparison with a mold of Si, quartz, Ni, or the like, it allows molding of a pattern in a large area, has high releasability, allows uniform press on a non-flat plane, and is inexpensive.

The conditions of the main process parameters in the step, which include an imprint temperature, imprint pressure, and imprint time, vary in accordance with an object to be molded.

In particular, the imprint temperature is preferably greater than or equal to 40° C. and less than or equal to the glass-transition temperature of the polyimide resin composition used, or more preferably, 120° C.

FIG. 3 is a graph showing the influence of the imprint molding temperature conditions ((a) 100° C. and (b) 120° C.) on the stability of pattern dimensions.

As shown in FIG. 3, the temperature of the thermal imprint molding is one of the factors that can change the influence on pattern shrinkage after heat treatment described below. Increasing the temperature of the thermal imprint molding before the light exposure from 100 to 120° C. can reduce the amount of pattern shrinkage after curing to less than or equal to 4%.

(c) Cooling and Releasing Step

After the imprint molding, the polyimide and the mold are cooled to a temperature of less than the glass-transition temperature, for example, down to 60° C., and then, the polyimide is released from the mold (See FIG. 1C).

The cooling method is not particularly limited, and natural cooling may be employed. However, forced cooling is preferably performed by, for example, flowing water through a water pipe that is disposed around the molding space from the perspective of molding cycles.

(d) Light Exposure Step

After the polyimide is released from the mold, light exposure is performed (see FIG. 1D).

Light exposure is typically performed through ultraviolet irradiation, though it differs depending on a photosensitizing agent used.

A reason for performing light exposure after the polyimide is released from the mold is that there has been a problem that if light exposure is performed before the polyimide is released from the mold, the flexible resin mold and the polyimide film may stick together after the light exposure. In addition, although optical imprint molding that uses typical photosensitive resin should necessarily use a transparent mold (i.e., quartz or resin), the method of the present embodiment is advantageous in that the range of selectable molds is wide because an opaque mold of Si, Ni, or the like can also be used.

(e) Heat Treatment Step

The final step is heat treatment (FIG. 1E).

The thermal imprinting step that uses the negative photosensitive polyimide resin composition of the present invention does not require a development step unlike photolithography. Therefore, post exposure bake (PEB) can be integrated with a curing step.

Figure 4A:
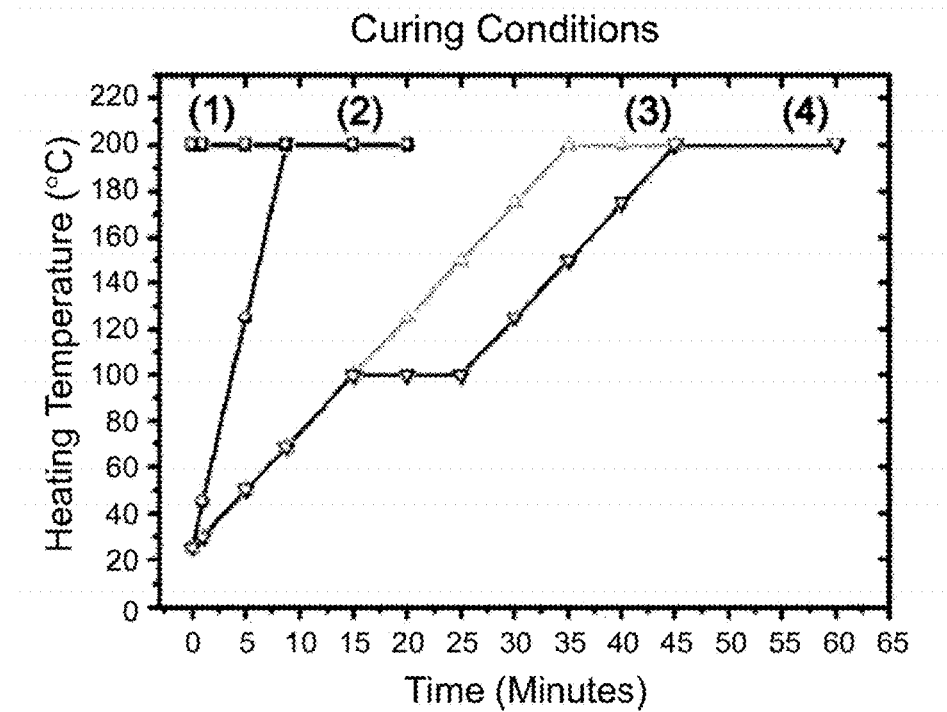
FIGS. 4A-4B are graphs showing the influence of the conditions of heat treatment after molding on pattern shrinkage.
Figure 4B:
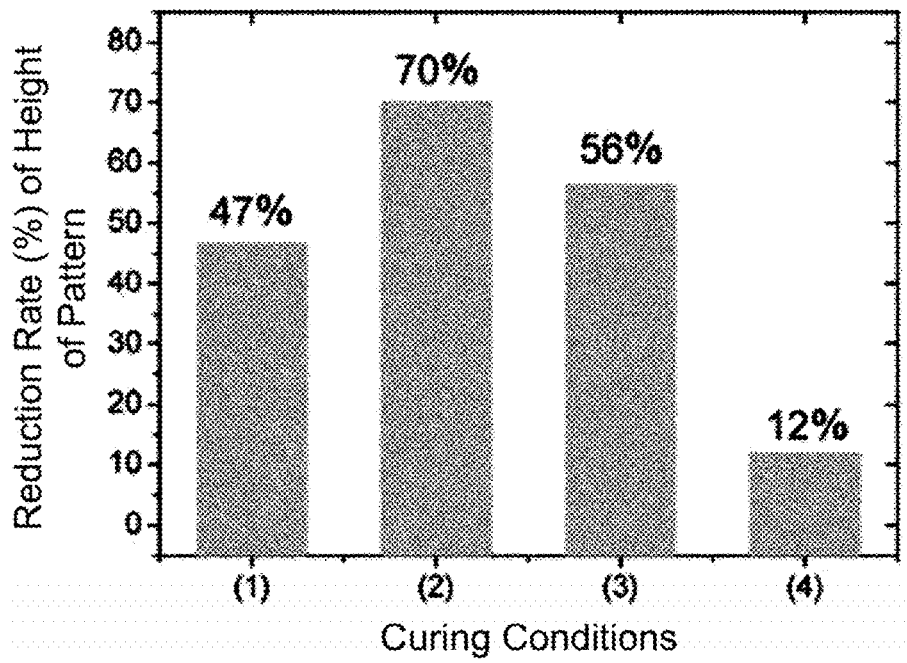
Figure 5A:
FIGS. 5A-5E are photographs showing L & S of microscale imprint patterns obtained in an example.
Figure 5B:
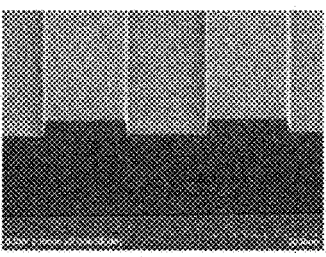
Figure 5C:
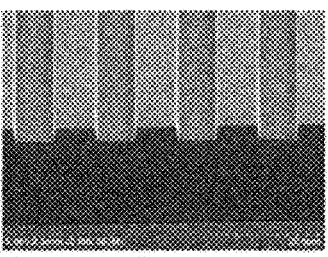
Figure 5D:
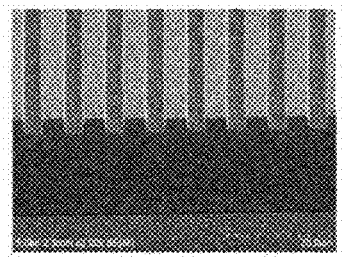
Figure 5E:
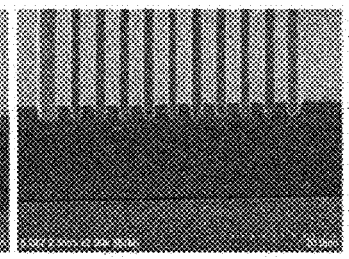

FIGS. 4A-4B are graphs showing the influence of the conditions of heat treatment after molding on pattern shrinkage. As shown in FIG. 4A, pattern shrinkage under the following four heating conditions was inspected.

(1) Heated for 20 minutes using a hot plate heated to 200° C.
(2) Heated from the room temperature to 200° C. at a heating rate of 20° C./min.
(3) Heated from the room temperature to 200° C. at a heating rate of 5° C./min.
(4) Held at a post exposure bake temperature (100° C.) of the photosensitive polyimide resin composition used for a given period of time, and was then heated from the room temperature to 200° C. at a heating rate of 5° C./min.

As shown in FIG. 4B, the range of changes in the shrinkage due to changes in the conditions of the heat treatment after molding is 70 to 12%.

As shown in the following examples, it was found possible to improve the shrinkage down to 14% or less by holding the photosensitive polyimide resin composition used at 100° C., which is a post exposure bake temperature of the composition, during two-stage heating performed at a heating rate of 5° C./min, that is, during heating, and then heating the composition again.

EXAMPLES

Although the present invention will be hereinafter described based on examples, the present invention is not limited thereto.

Example 1: Formation of Micrometer Pattern

In the present example, a commercially available organic-solvent-soluble polyimide resin composition (Q-RP-X1149-X, PI R&D Co., Ltd) was used.

The composition contains a solvent-soluble siloxane-modified block copolymerized polyimide (with a glass-transition temperature of 192° C.), gamma butyrolactone (solvent), methyl benzoate (solvent), and a photosensitizing agent. The amount of shrinkage in the film thickness after curing was about 1%, which is quite small in comparison with a shrinkage of 30% in the film thickness of the commonly used non-photosensitive polyimide after curing (see FIG. 2(a)).

For a substrate, a Si substrate (with a thickness of 725 μm and a diameter of 8 inches) was used.

A mold was produced through a thermal imprinting process as follows, using a commercially available resin sheet (i.e., an intermediate polymer stamp (IPS) sheet produced by Obducat AB; a glass-transition temperature of 150° C.) that has a hydrophobic property and thus has excellent releasability.

A resin film with a thickness of 200 μm was heated to a temperature around the glass-transition temperature until it softens. Then, using a Si master mold, pressure molding was performed with an imprint pressure of 4 MPa for two minutes. Then, the resin film and the mold were cooled down to 60° C. so that the resin film was released from the mold.

In the present example, five projection/recess patterns with depths of 4 μm and line widths of 3 μm, 5 μm, 10 μm, 20 μm, and 50 μm, respectively, were produced.

The aforementioned resin composition was applied to the Si substrate to a thickness of 25 μm through spin coating, and then, prebaking was performed at 100° C. for 4 minutes to form a resin film.

Next, with the aforementioned mold placed on the substrate with the resin film, the resin film was heated to 100 to 120° C. until it softens, and was then pressure-molded. After that, the resin film and the mold were cooled down to 60° C. so that the resin film was released from the mold.

A surface of the molded resin film was irradiated with ultraviolet rays (with a wavelength of 365 nm and an illuminance of 30 mW/cm$^2$) using an ultraviolet light source provided in a nanoimprint system. Then, heat treatment of two-stage heating was performed where the film was first heated to 100° C. at a heating rate of 5° C./min, and was then held at 100° C., and was further heated to 200° C.

The illumination, the exposure time, and the exposure dosage of the ultraviolet irradiation were 30 mW/cm$^2$, 40 seconds, and 1200 mJ/cm$^2$, respectively.

FIGS. 5A-5E are photographs showing L & S of imprint patterns produced in the present example.

As shown in FIGS. 5A-5E, L & S pattern structures of 50 to 3 μm, which have sharp line edges and rectangular cross-sections, are favorably formed.

Example 2: Formation of Submicrometer Patterns

In the present example, molds having produced thereon three types of projection/recess patterns, which have depths of 188 nm and line widths of 150 nm, 200 nm, and 300 nm, respectively, were used in the same way as in Example 1 except that a Si substrate with a thickness of 500 μm and a diameter of 4 inches was used and the pressing time was 3 minutes.

Submicrometer patterns were formed in the same way as in Example 1 except the substrate and the mold.

Figure 6A:
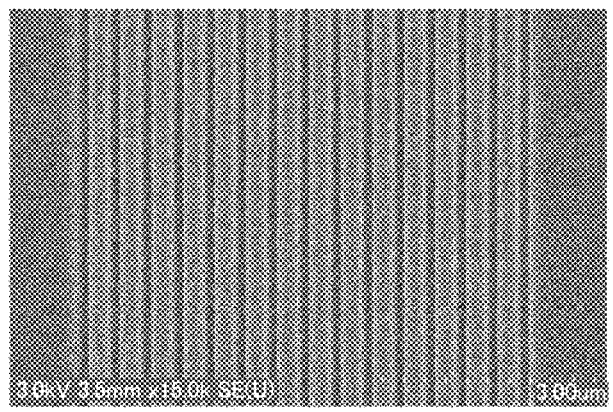
FIGS. 6A-6C are photographs showing L & S of nanoscale imprint patterns obtained in an example.
Figure 6B:
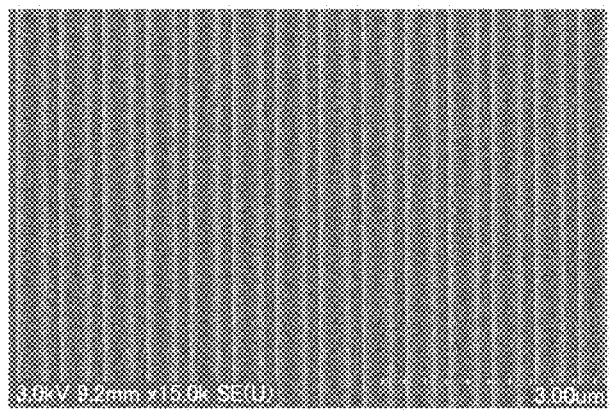
Figure 6C:
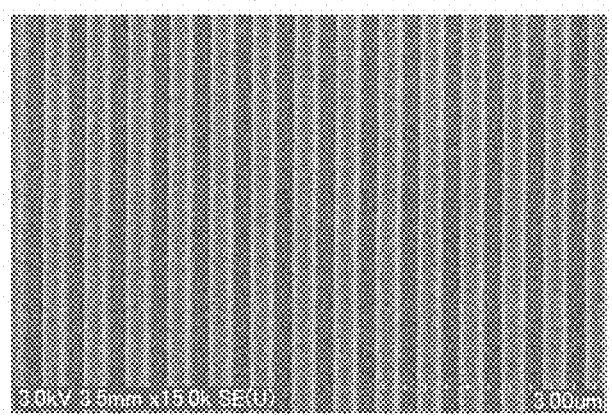

FIGS. 6A-6C are photographs showing L & S of imprint patterns produced in the present example.

As shown in FIGS. 6A-6C, submicrometer pattern structures with rectangular cross-sections are favorably formed.

As shown in Examples 1 and 2, when an imprinting technique is used, each case has no problems in the patterning accuracy, such as the light diffraction limit of photolithography, and the obtained patterns theoretically conform to the mold patterns.

It should be noted that the molded polyimide can be physically peeled off if the base Si substrate is subjected to water-repellent treatment in advance, for example, either before or after curing so that the adhesion becomes lower. Thus, a flexible polyimide substrate can be produced.

FIGS. 7A-7B are photographs of a flexible polyimide substrate obtained in the example, specifically, FIG. 7A is a photograph after thermal imprint molding, and FIG. 7B is a photograph of a polyimide substrate after it is peeled off a Si substrate (and before it is cured).

The invention claimed is:

1. A method for forming a micropattern of polyimide using thermal imprinting, the method comprising:
   forming a polyimide film made of a solvent-soluble polyimide resin composition that is photosensitive and is moldable at a temperature of less than or equal to a glass-transition temperature;
   heating the polyimide film at a temperature of less than or equal to the glass-transition temperature and pressing a mold against the polyimide film to form a micro projection/recess pattern on a surface of the polyimide film;

cooling the polyimide film and the mold and releasing the mold from the polyimide film;

irradiating the polyimide film with ultraviolet rays to perform light exposure thereon; and heating the polyimide film to thermally cure the polyimide film.

2. The method for forming a micropattern of polyimide according to claim 1, wherein thermally curing the polyimide film comprises a two-stage heating where the polyimide film is held at a post exposure bake temperature for a given period of time while a temperature is increased from a room temperature to a heat treatment temperature.

3. The method for forming a micropattern of polyimide according to claim 1, wherein the micro projection/recess pattern is one of a micrometer or submicrometer projection/recess pattern with a rectangular cross-section.

4. The method for forming a micropattern of polyimide according to claim 1, wherein the solvent-soluble polyimide resin composition is a solvent-soluble block copolymerized polyimide resin composition.

\* \* \* \* \*